United States Patent [19]
Martinez-Tovar et al.

[11] Patent Number: 5,992,326
[45] Date of Patent: Nov. 30, 1999

[54] VOLTAGE-PROTECTED SEMICONDUCTOR BRIDGE IGNITER ELEMENTS

[75] Inventors: Bernardo Martinez-Tovar, Albuquerque; Martin C. Foster, Placitas, both of N.Mex.

[73] Assignee: The Ensign-Bickford Company, Simsbury, Conn.

[21] Appl. No.: 08/985,926

[22] Filed: Dec. 5, 1997

Related U.S. Application Data

[60] Provisional application No. 60/034,015, Jan. 6, 1997.

[51] Int. Cl.$^6$ ..................................... F42C 19/08
[52] U.S. Cl. .................................. 102/202.4; 102/202.5; 102/202.7
[58] Field of Search .............................. 102/202.1, 202.2, 102/202.3, 202.4, 202.5, 202.7, 202.8, 218, 202.9, 206

[56] References Cited

U.S. PATENT DOCUMENTS

| | | |
|---|---|---|
| 3,018,732 | 1/1962 | Tognola . |
| 3,019,732 | 2/1962 | Kaspaul . |
| 3,211,096 | 10/1965 | Forney et al. . |
| 3,292,537 | 12/1966 | Goss, Jr. . |
| 3,366,055 | 1/1968 | Hollander, Jr. . |
| 3,409,804 | 11/1968 | Bankston, Jr. .......................... 102/218 |

(List continued on next page.)

FOREIGN PATENT DOCUMENTS

| | | | |
|---|---|---|---|
| 405099597 | 4/1993 | Japan .................................. | 102/202.5 |
| 2123122 | 1/1984 | United Kingdom ................ | 102/202.5 |

OTHER PUBLICATIONS

G. Zhang et al; "Characteristic Voltage of Programmed Metal–to–Metal Antifuses"; *IEEE Electron Device Letters*, vol. 15, No. 5, May 1994, pp. 166–168.

Shoue–Jen Wang et al; "High–Performance Metal/Silicide Antifuse"; *IEEE Electron Device Letters*, vol. 13, No. 9, Sep. 1992, pp. 471–472.

David K. Liu et al; "Scaled Dielectric Antifuse Structure for Field–Programmable Gate Array Applications"; *IEEE Electron Device Letters*, vol. 12, No. 4, Apr. 1991, pp. 151–153.

Simon S. Cohen et al; "A Novel Double–Metal Structure for Voltage–Programmable Links"; *IEEE Electron Device Letters*, vol. 13, No. 9, Sep. 1992, pp. 488–490.

R. Blewer et al; "Thick Tungsten Films In Multilayer Conductor Systems: Properties and Deposition Technique"; 1984 Proceedings, First International IEEE VLSI Multilevel Interconnection Conference, New Orleans, LA, Jun. 21–22, 1984, pp. 153–158.

R. Smith et al; "Design of Solid–State Film–Bridge Detonators With Heat Transfer Calculations for Film–Bridge and Hot–Wire Electro–Explosive Devices"; NWC TP 6448, Sep. 1983, pp. 1–53, 55–97.

Schwarz, Alfred C., "Experimental Performance of the TC817 Flying Plate Test Device"; SAND 78–1491, Feb. 1979, pp. 3–22.

*Primary Examiner*—Charles T. Jordan
*Assistant Examiner*—Christopher K. Montgomery
*Attorney, Agent, or Firm*—Law Office of Victor E. Liebert; Victor E. Liebert

[57] ABSTRACT

A semiconductor bridge igniter device (10) having integral voltage anti-fuse protection provides an electric circuit including a firing leg and, optionally, a monitor leg. The firing leg comprises semiconductor pads (14a, 14b) separated and connected by a bridge (14c) and having metallized lands (16a, 16b) disposed over the pads (14a, 14b) so that an electrical potential applied across the metallized lands (16a, 16b) will cause sufficient current to flow through the firing leg of the electric circuit to release energy at the bridge (14c). A dielectric layer (15) is interposed within the firing leg and has a breakdown voltage equal to a selected threshold voltage ($V_{th}$) and therefore provides protection against the device functioning at voltages below the threshold voltage ($V_{th}$). A continuity monitor leg of the electric circuit is comprised of either a fusible link (34) or a resistor (36) disposed in parallel to the firing leg.

10 Claims, 5 Drawing Sheets

U.S. PATENT DOCUMENTS

| | | |
|---|---|---|
| 3,602,952 | 9/1971 | Grinnell . |
| 3,669,022 | 6/1972 | Dahn et al. . |
| 3,682,096 | 8/1972 | Lüdke et al. . |
| 3,793,954 | 2/1974 | Johnston .......................... 102/202.4 |
| 3,882,324 | 5/1975 | Smolker et al. ................. 102/202.5 |
| 3,974,424 | 8/1976 | Lee . |
| 3,978,791 | 9/1976 | Lemley et al. . |
| 4,428,292 | 1/1984 | Riggs . |
| 4,471,697 | 9/1984 | McCormick et al. . |
| 4,484,523 | 11/1984 | Smith et al. ..................... 102/202.5 |
| 4,586,435 | 5/1986 | Bock ................................. 102/202.5 |
| 4,699,241 | 10/1987 | Kerekes ............................... 102/218 |
| 4,708,060 | 11/1987 | Bickes, Jr. et al. ............. 102/202.7 |
| 4,729,315 | 3/1988 | Proffit et al. ..................... 102/202.9 |
| 4,769,734 | 9/1988 | Heinemeyer et al. ................. 361/56 |
| 4,796,562 | 1/1989 | Brors et al. ............................ 118/725 |
| 4,819,560 | 4/1989 | Patz et al. ........................ 102/202.5 |
| 4,831,933 | 5/1989 | Nerheim et al. ................. 102/202.5 |
| 4,840,122 | 6/1989 | Herheim ........................... 102/202.5 |
| 4,862,803 | 9/1989 | Nerheim et al. ................. 102/202.5 |
| 4,893,564 | 1/1990 | Ochi et al. ........................... 102/218 |
| 4,976,200 | 12/1990 | Benson et al. ................... 102/202.7 |
| 5,029,529 | 7/1991 | Mandigo et al. ................ 102/202.9 |
| 5,085,146 | 2/1992 | Baginski ........................... 102/202.5 |
| 5,094,167 | 3/1992 | Hendley, Jr. ........................ 102/218 |
| 5,173,570 | 12/1992 | Braun .................................. 102/347 |
| 5,243,911 | 9/1993 | Dow et al. ........................ 102/202.2 |
| 5,249,095 | 9/1993 | Hunter ................................. 361/251 |
| 5,285,727 | 2/1994 | Reams, Jr. et al. ............. 102/202.5 |
| 5,309,841 | 5/1994 | Hartman et al. ................ 102/202.4 |
| 5,327,834 | 7/1994 | Atkeson ............................ 102/202.9 |
| 5,367,428 | 11/1994 | Aresco et al. ....................... 361/251 |
| 5,385,097 | 1/1995 | Hruska et al. ................... 102/202.5 |
| 5,731,538 | 3/1998 | O'Brien et al. .................. 102/202.5 |
| 5,746,926 | 5/1998 | Bonbrake et al. ................. 102/215 |
| 5,798,475 | 8/1998 | Reynes et al. ................... 102/202.5 |
| 5,831,203 | 11/1998 | Ewick ............................... 102/202.5 |

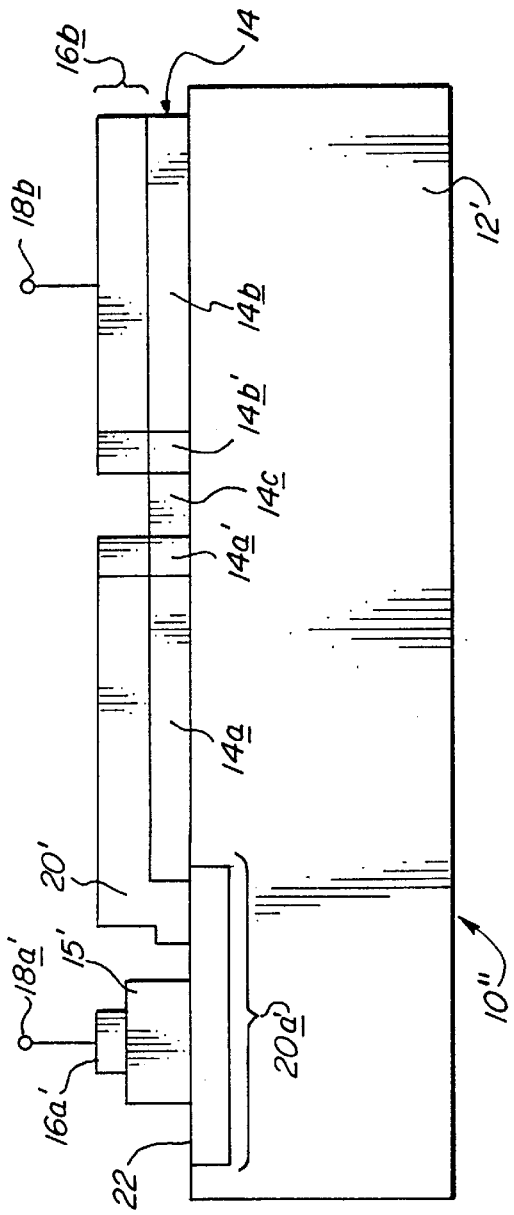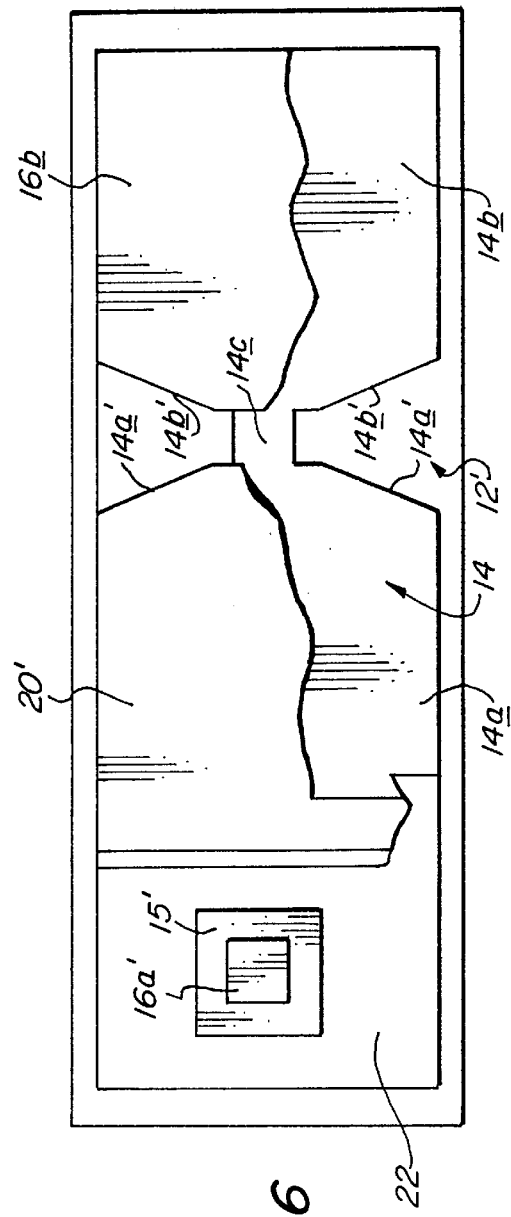

VOLTAGE-PROTECTED SEMICONDUCTOR BRIDGE IGNITER ELEMENTS

CLAIM OF DOMESTIC PRIORITY

The benefit of priority of U.S. Provisional Patent Application Ser. No. 60/034,015, filed Jan. 6, 1997 and entitled "High Voltage Protection For Semiconductor Bridge (SCB) Elements", is claimed for this application.

BACKGROUND OF THE INVENTION

1. Field of the Invention

The present invention is concerned with voltage-protected semiconductor bridge igniter elements, such elements having integral high voltage protection and, optionally, integral continuity testing capability.

2. Related Art

Semiconductor bridge ("SCB") elements, means to electrically connect them for the purpose of electrical activation, and the use of such devices as igniters to initiate explosives, are well-known in the art. Presently, both the SCB of U.S. Pat. No. 4,708,060, to Bickes, Jr. et al, issued Nov. 24, 1987, and the tungsten bridge SCB of U.S. Pat. No. 4,976,200, to Benson et al, issued Dec. 11, 1990, are manufactured with large metallized pads for electrical contact to the active area of the bridge. The disclosure of U.S. Pat. Nos. 4,708,060 and 4,976,200 is incorporated herein. The SCB chip generally is mechanically bonded to an attachment surface of a header or other element of an electro-explosive device ("EED"). Proper functioning of the SCB in a detonator requires intimate contact with an energetic material such as an explosive or pyrotechnic material, and thus demands an upright position for the chip; that is, the chip cannot be assembled with its active area positioned against the attachment surface, but its active area must face towards and contact the energetic material so that the active area is free to interact with the energetic material, i.e., to impart energy thereto to initiate the energetic material.

Voltage protection for SCB elements is a highly desirable safety attribute used to prevent accidental functioning of explosive devices in the presence of stray voltage. In general, high voltage protection prevents voltages below a threshold voltage ("$V_{th}$") from inducing current flow through the SCB. However, for voltages above $V_{th}$, a current will flow through the SCB with sufficient amplitude to function the SCB and thereby generate a plasma that will initiate an explosive load placed in intimate contact with the SCB or serve some other desired function. Therefore, $V_{th}$, is defined as the voltage that has to be exceeded before the SCB can be functioned. Such threshold voltages are generally in the range of from about 10 V to about 1000 V. It is known to provide high voltage protection for SCBs by various means; for example, spark gaps, near-intrinsic semiconductor films or substrates, and semiconductor diodes.

Spark gaps consist of a pair of encapsulated electrodes packaged in a gas or vacuum environment that are separated by a specific distance or "gap". The gap, in general, determines the breakdown or threshold voltage of the device. The "gap" must be accurately and consistently controlled during the assembly process to reduce the variability range of the threshold voltage. Such a highly controlled encapsulation and electrode spacing process is quite expensive. Another drawback of this spark gap approach is that the continuity of the SCB is not easy to monitor unless a voltage greater than the spark gap breakdown voltage is applied for a very short period of time. This situation of course causes an unsafe condition of flowing high current through the SCB.

Near-intrinsic semiconductor films or substrates may also be used for voltage protection. A near-intrinsic semiconductor can be designed to have a particular volume and a particular resistance value selected so that, upon the application of voltages in excess of $V_{th}$, enough heat will be generated to create additional carriers that will lower the resistance of the device and eventually cause current flow. Such current flow is a consequence of the negative differential resistance that intrinsic semiconductors typically exhibit. Near-intrinsic semiconductor films require very low doping levels which are difficult to control because they depend mainly on two processes: i) thermal effects such as thermal diffusion and/or thermal annealing after, for example, ion implantation and, ii) high controllability in the impurity level during the in situ growth of the semiconductor film. In addition to the difficulty of controlling a low doping level, both the impedance and the size of the near-intrinsic element must be properly designed to permit the available energy to be rapidly delivered to heat and vaporize the film to create the plasma that will set off the explosive load.

Semiconductor diodes have been used to prevent current flow caused by applied voltages below the characteristic breakdown or threshold voltage that occur at the diode's junction when biased in the reverse mode. However, this protection is lost when the diode is biased in the forward mode, therefore making the diode-protected SCB a polarized device. To alleviate this polarization problem, back-to-back diodes may be used in series with the SCB to provide protection for the SCB in both polarities. However, a major drawback of this approach is the low doping level required for high breakdown voltages for a single diode and the need for different wafers (substrates) for different breakdown voltages. For example, a diode with 500 V breakdown voltage requires a substrate doping concentration of less than $10^{15}$ per $cm^3$, which is impractical because of the difficulty of controlling such low concentrations of dopants. A solution which avoids the necessity for low doping levels is to use multiple low-voltage diodes interconnected in series with the SCB and in a back-to-back configuration. This, of course, results in a more elaborate design and use of a larger chip area. Another drawback of this back-to-back diode approach is that the continuity of the SCB is not easy to monitor unless a voltage greater than the diode breakdown voltage is applied for a very short period of time. This situation, of course, causes an unsafe condition of flowing high current through the SCB. There is, therefore, in addition to a need for an improved structure to provide high voltage protection for SCBs and the like, a need for an improved structure to enable continuity monitoring of the SCB device at various points during its manufacturing process and just prior to its use.

SUMMARY OF THE INVENTION

Generally, the present invention provides a semiconductor bridge (SCB) igniter element having integral high voltage protection and, optionally, DC current continuity monitoring capability. Such integral high voltage protection is achieved by interposing a dielectric material within the semiconductor bridge igniter element as a controllable anti-fuse. An anti-fuse is provided by a dielectric material which, upon the application of a sufficiently large voltage, i.e., the threshold voltage ($V_{th}$), will break down to form a link through the dielectric material. As stated in *A Novel Double-Metal Structure for Voltage-Programmable Links* by Simon S. Cohen et al, in IEEE Electron Device Letters, Vol. 13, No. 9, September 1992, p. 488, the breakdown process of the dielectric material proceeds in three steps. First, the insulator is stressed by the applied field. Next, a filament forms in the insulation when sufficient current is available and, finally, the filament grows by a combination of Joule heating and chemical reactions for which a much larger current is required. The final state of the ruptured dielectric layer and filament formation is a low impedance link connecting the high voltage source with an element on the other side of the dielectric, in this case with the SCB igniter element. A fusible link or resistor is optionally connected in parallel to the dielectric anti-fuse SCB igniter to provide a continuity monitor leg of the circuit.

Specifically, in accordance with the present invention, there is provided a semiconductor bridge igniter device having protection against functioning at voltages below a preselected threshold voltage. The igniter device defines an electric circuit and comprises the following components. A substrate is made from a non-conductive material, has a polysilicon layer disposed on the substrate and is dimensioned and configured to have first and second pads having therebetween a gap which is bridged by an initiator bridge connecting the first and second pads. The bridge is so dimensioned and configured that passage therethrough of an electric current of selected characteristics releases energy at the bridge. First and second metallized lands are disposed in electrically conducting contact with, respectively, the first and second pads to define a firing leg of the electric circuit comprised of the first and second metallized lands, the first and second pads and the bridge. A dielectric material having a breakdown voltage equal to the threshold voltage is interposed in series in the firing leg of the electric circuit whereby the circuit can only be closed upon application thereto of a voltage potential at least as great as the threshold voltage.

In another aspect of the present invention, the dielectric material is a dielectric layer interposed between the polysilicon layer and the first metallized land.

In yet another aspect of the present invention the first metallized land is disposed remotely of the first pad and on the dielectric layer, and the dielectric layer is electrically connected to the first pad by a conductive layer.

In yet another aspect of the present invention a doped silicon region of the substrate material is disposed between the dielectric layer and the conductive layer and provides an electrical connection therebetween.

The present invention provides, in another aspect, for the electric circuit to further comprise a continuity monitor leg comprising a fusible link connected in parallel to the firing leg. The fusible link, which may comprise a thin film fusible link, is dimensioned and configured to rupture at an amperage above that of a selected monitor amperage whereby, if the monitor amperage is exceeded, the fusible link will rupture and open the monitor leg.

Yet another aspect of the present invention provides for the electric circuit to further comprise a continuity monitor leg comprising a resistor connected in parallel to the firing leg. The resistor may comprise a doped segment of the polysilicon layer or of the non-conductive substrate. In any case, the resistor has a resistance value large enough to reduce the current flow through the firing leg of the electric circuit (and thereby reduce the generation of heat within the chip) to a level at which the temperature of the semiconductor bridge device remains below a preselected temperature. In a related aspect of the present invention wherein the semiconductor bridge igniter device comprises an electro-explosive device and is disposed in contact with an energetic material, e.g., a primary explosive, the preselected temperature is the auto-ignition temperature of the energetic material.

BRIEF DESCRIPTION OF THE DRAWINGS

FIG. 5 is a schematic elevation view of a voltage-protected semiconductor bridge igniter device in accordance with yet another embodiment of the present invention;

FIG. 6 is a top plan view of the igniter device of FIG. 5;

DETAILED DESCRIPTION OF THE INVENTION AND PREFERRED EMBODIMENTS THEREOF

Voltage-Protected SCB Device

In the present invention a semiconductor bridge igniter device is voltage-protected (sometimes herein referred to as "voltage-blocked") by an anti-fuse comprising a dielectric layer (e.g., silicon dioxide) sandwiched between two highly conductive electrodes such as electrodes made of n-doped polysilicon, of low melting point metals (e.g., Al, Cu, Au, etc.), of refractory metals (e.g., W, Mo, Co, etc.) and/or a combination of two or more thereof. The dielectric layer is selected in such a way that its thickness and dielectric field strength in volts per centimeter of thickness of the dielectric layer (V/cm) will result in a sudden rupture of the dielectric layer at the desired high voltage threshold value ($V_{th}$). For example, silicon dioxide with a dielectric strength of $10^7$ V/cm and a film thickness of approximately $0.5\mu$ will break down when a voltage of approximately 500 V is applied. The time to break down the dielectric is extremely short; that is, it is equivalent to that of the time associated with generation of a spark and is measured in microseconds or even nanoseconds. Thinner films have lower threshold voltages ($V_{th}$) and vice-versa. Thus, the presence of a high voltage and the sudden formation of the filament in the dielectric layer having a short-circuit-like response will cause currents in excess of the required firing level for the semiconductor bridge igniter element such that the element will heat and vaporize, resulting in a plasma that sets off the explosive charge placed in proximity to the igniter. In general, the metal-insulation-metal anti-fuse concept is such that high voltage protection is offered by the dielectric layer for voltage values below the rupture or breakdown voltage of the dielectric layer which is selected to establish it as the threshold voltage ($V_{th}$). $V_{th}$ is determined mainly by the material of which the dielectric layer is made and its thickness. Voltages at least as great as $V_{th}$ will rupture the dielectric layer, fuse the two electrodes together, and expose the semiconductor bridge igniter element to the applied high voltage with the subsequent heating and vaporization of the semiconductor bridge igniter element to function the electro-explosive device ("EED") of which it is a part.

Figure 7:
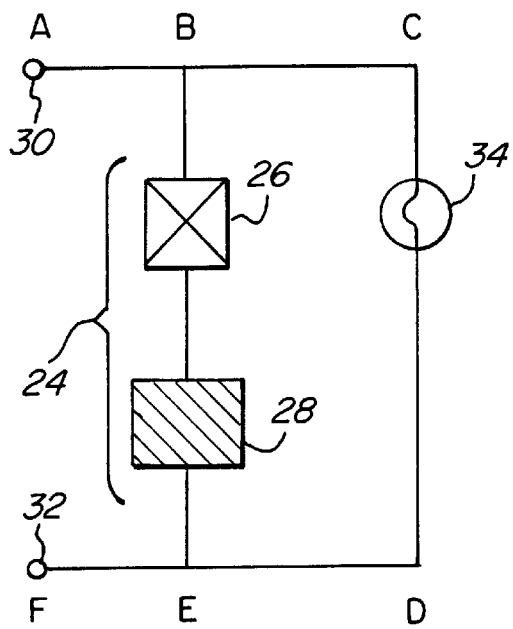
FIG. 7 is a circuit diagram of a voltage-protected semiconductor bridge igniter device in accordance with one embodiment of the present invention comprising a fusible link disposed in parallel to the firing leg of the electric circuit of the device.
Figure 8:
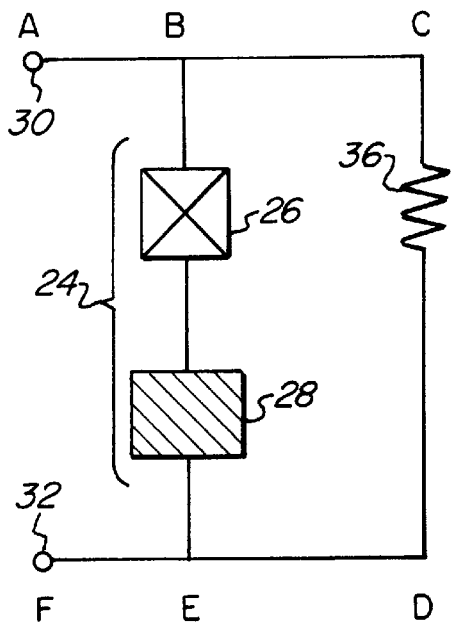
FIG. 8 is a circuit diagram of a voltage-protected semiconductor bridge igniter device in accordance with another embodiment of the present invention comprising a high-resistance resistor disposed in parallel to the firing leg of the electric circuit of the device.
Figure 9:
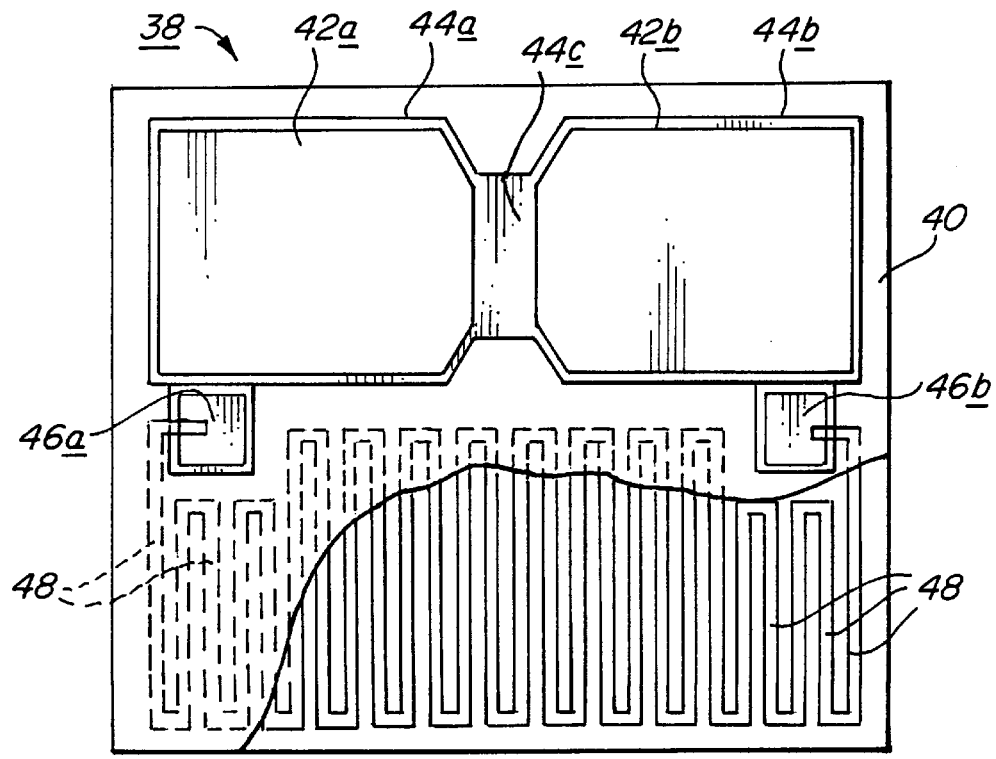
FIG. 9 is a schematic plan view of a voltage-protected semiconductor bridge igniter device in accordance with the embodiment illustrated in FIG. 8 and including a serpentine high-resistance resistor disposed in parallel to the firing leg of the electric circuit of the device.

FIGS. 1 through 9 are schematic and are not drawn to scale; the size of certain elements are exaggerated for clarity of illustration. Identical elements of FIGS. 1 through 6 are represented by the same element numbers and similar elements are represented by the same element numbers having a prime added thereto, e.g., 16a". FIGS. 7 through 9 employ a separate numbering scheme.

Figure 1:
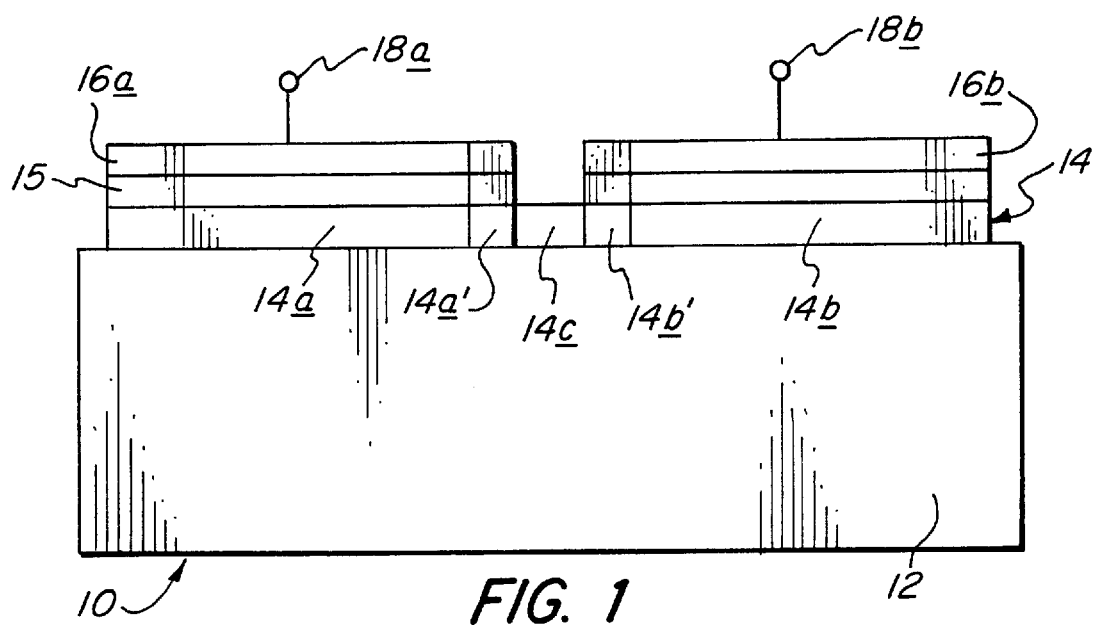
FIG. 1 is a schematic elevation view of a voltage-protected semiconductor bridge igniter device in accordance with one embodiment of the present invention.
Figure 2:
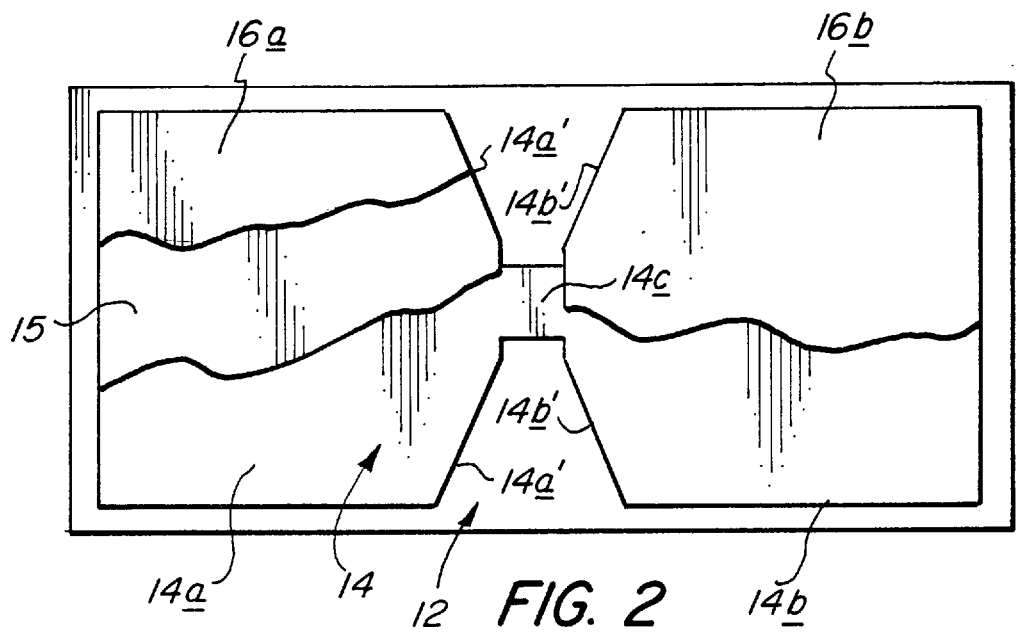
FIG. 2 is a top plan view of the igniter device of FIG. 1.

Referring now to FIGS. 1 and 2, there is shown a semiconductor bridge device 10 having an electrically non-conducting substrate 12 which may comprise any suitable electrically non-conducting material. Generally, as is well-known in the art, a non-conducting substrate can be a single or multiple component material. For example, a suitable non-conducting substrate for a polycrystalline silicon semiconductor material comprises an insulating layer (e.g., silicon dioxide, silicon nitride, etc.) disposed on top of a monocrystalline silicon substrate. This provides a well-known suitable combination of materials for substrate 12. A suitable non-conducting substrate for monocrystalline silicon semiconductor materials comprises sapphire, also a known suitable material for substrate 12. An electrically-conducting material comprising, in the illustrated embodiment, a heavily doped polysilicon semiconductor 14 is mounted on substrate 12 by any suitable means known in the art, for example, by epitaxial growth or low pressure chemical vapor deposition techniques. As best seen in FIG. 2, semiconductor 14 comprises a pair of pads 14a, 14b which in plan view are substantially rectangular in configuration except for the facing sides 14a', and 14b' thereof which are tapered towards initiator bridge 14c. Bridge 14c connects pads 14a and 14b and is seen to be of much smaller surface area and size than either of pads 14a, 14b. Bridge 14c is the active area of the semiconductor bridge device 10. It is seen from FIG. 2 that the resultant configuration of the semiconductor 14 somewhat resembles a "bow tie" configuration, with the large substantially rectangular pads 14a, 14b spaced apart from and connected to each other by the small initiator bridge 14c. A dielectric layer 15 is mounted on rectangular pad 14a of semiconductor 14. Dielectric layer 15 is partly broken away in FIG. 2 in order to show pad 14a and, in the illustrated embodiment, entirely covers the upper surface of pad 14a. A pair of metallized lands 16a and 16b, partly broken away in FIG. 2 in order to partially show dielectric layer 15 and pad 14b, respectively, overlie dielectric layer 15 and pad 14b and, in the illustrated embodiment, entirely cover the upper surfaces of the same. Metallized lands 16a and 16b are substantially identical. The prior art generally teaches the use of aluminum or tungsten for the lands 16a and 16b although any suitable metal or combination of metals may be used. Electrical contacts 18a and 18b may be attached, respectively, to lands 16a and 16b thereby enabling the electrical connection of any suitable external voltage source to the SCB. Alternately, lands 16a and 16b may be directly connected to a printed circuit board or the like thereby enabling the electrical connection of any suitable external voltage source to the SCB.

In operation, the semiconductor bridge device of the present invention is electrically connected to an external voltage source that provides a voltage potential. Dielectric layer 15 acts as an insulator thereby preventing a voltage potential from being applied across initiator bridge 14c. As discussed above, dielectric layer 15 will break down or rupture and form an electric filament after a voltage (activation voltage) in excess of $V_{th}$ is applied across initiator bridge 14c for a sufficient amount of time. Once dielectric layer 15 is breached, i.e., a conductive filament is formed which extends between land 16a and pad 14a, the voltage potential applied across contacts 18a and 18b will cause current to flow through initiator bridge 14c. When a current of sufficient intensity is applied for a sufficient length of time, initiator bridge 14c erupts with the formation of a plasma, which will serve to provide a heat source for use in, e.g., initiating energetic materials packed in contact with initiator bridge 14c.

Figure 3:
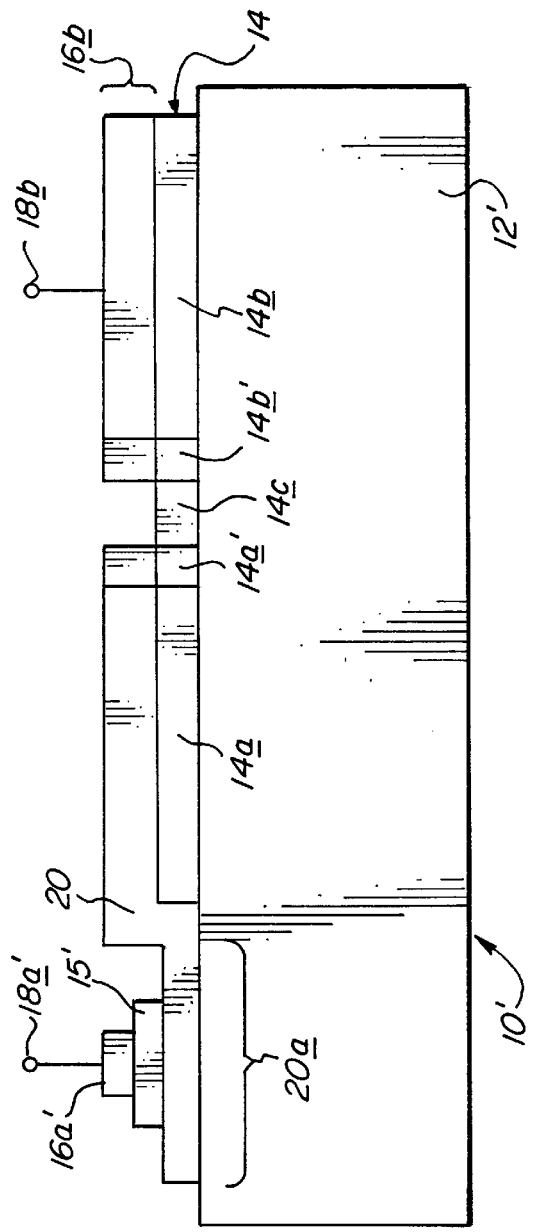
FIG. 3 is a schematic elevation view of a voltage-protected semiconductor bridge igniter device in accordance with another embodiment of the present invention.
Figure 4:
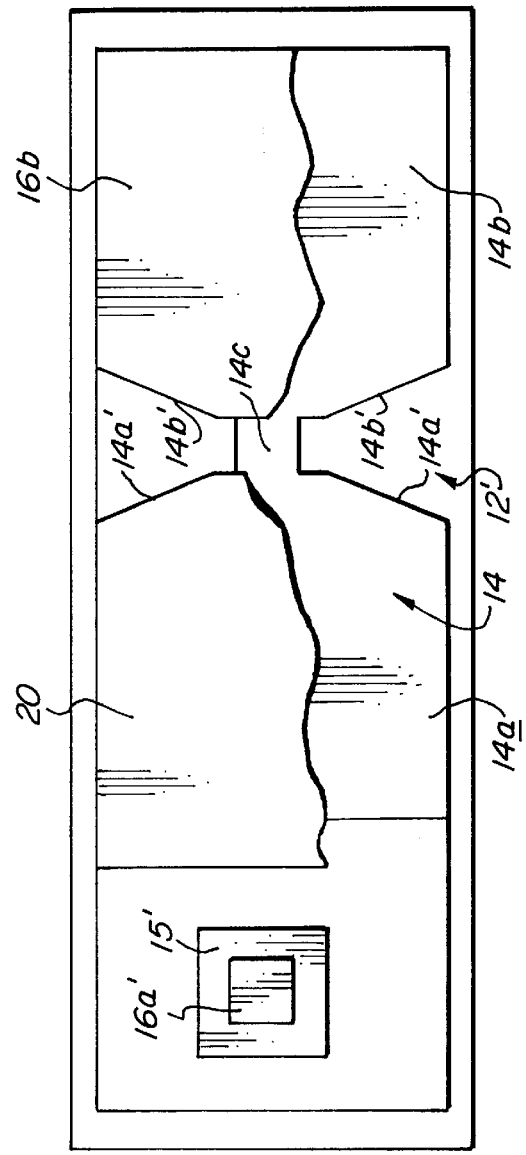
FIG. 4 is a top plan view of the igniter device of FIG. 3.

Referring now to FIGS. 3 and 4, there is shown a semiconductor bridge device 10' of another embodiment of the present invention having an electrically non-conducting substrate 12'. An electrically-conducting semiconductor 14 which is identical to that of semiconductor 14 of the embodiment of FIGS. 1 and 2 and therefore is not further described, is mounted on substrate 12' such that a portion of substrate 12' is left exposed. A metallized conductive layer 20 is mounted on upper and side surfaces of rectangular pad 14a and extends to and along the exposed portion of substrate 12'. A dielectric layer 15' is mounted on the upper surface of conductive layer 20 within region 20a. Region 20a is the portion of conductive layer 20 that is mounted directly on substrate 12'. Dielectric layer 15' may extend to cover the entire upper surface of region 20a. A pair of metallized lands 16a' and 16b (land 16b being broken away in FIG. 4 in order to partially show rectangular pad 14b) overlaying dielectric layer 15' and pad 14b and, in the illustrated embodiment, entirely cover the upper surfaces of the same.

In operation, the semiconductor bridge device of FIGS. 3 and 4 provides integral voltage protection similar to that of the device of FIGS. 1 and 2. Dielectric layer 15 acts as an insulator thereby preventing a voltage potential from being applied across initiator bridge 14c. As discussed above, dielectric layer 15 will break down or rupture and form an electric filament after a voltage in excess of $V_{th}$ is applied across semiconductor bridge device 10 for a sufficient amount of time. Once dielectric layer 15 is breached, i.e., a conductive filament is formed which extends between land 16a and pad 14a, the voltage potential applied across contacts 18a' and 18b will cause current to flow through initiator bridge 14c. Specifically, the path of the current flow is through land 16a', the conductive filament formed in dielectric layer 15', conductive layer 20, pad 14a through initiator bridge 14c to pad 14b and land 16b. When a current of sufficient intensity is applied for a sufficient length of time, initiator bridge 14c erupts with the formation of a plasma, which will serve to provide a heat source for use in, e.g., initiating energetic materials packed in contact with initiator bridge 14c.

Referring now to FIGS. 5 and 6, there is shown a semiconductor bridge device 10" of yet another embodiment of the present invention, having an electrically non-conducting substrate 12'. An electrically-conducting semiconductor 14 which is identical to that of semiconductor 14 of the embodiment of FIGS. 3 and 4 and therefore is not further described, is mounted on substrate 12' such that a portion of substrate 12' is left exposed. A metallized conductive layer 20' is mounted on upper and side surfaces of rectangular pad 14a and extends to a short section of the exposed portion of substrate 12'. A localized n-doped silicon region 22 of substrate 12', located at the upper surface thereof, extends along the exposed portion of substrate 12', to electrically connect to conductive layer 20' in region 20a'. A dielectric layer 15' is mounted on the upper surface of n-doped silicon region 22. Dielectric layer 15' may extend to cover the entire upper surface of region 20a'. A portion of both conducting layer 20' and pad 14a are partly broken away in FIG. 6 in order to partially show n-doped silicon region 22. A pair of metallized lands 16a' and 16b (land 16b being partly broken away in FIG. 6 in order to partially show rectangular pad 14b), overlie dielectric layer 15' and pad 14b and, in the illustrated embodiment, entirely cover the upper surfaces of the same.

The semiconductor bridge device of FIGS. 5 and 6 provides integral voltage protection and operates in a manner which is similar to that of the semiconductor bridge devices of FIGS. 3 and 4. Once dielectric layer 15 is breached, i.e., a conductive filament is formed which extends between land 16a and pad 14a, the electric potential applied across contacts 18a' and 18b will cause current to flow through initiator bridge 14c. Specifically, the path of the current flow is through land 16a', the conductive filament formed in dielectric layer 15', the n-doped silicon region 22, conductive layer 20, pad 14a through initiator bridge 14c to pad 14b and land 16b. When a current of sufficient intensity is applied for a sufficient length of time, initiator bridge 14c erupts with the formation of a plasma, which will serve to provide a heat source for use in, e.g., initiating energetic materials packed in contact with initiator bridge 14c.

The above-described embodiments, which show placement of the anti-fuse on one of the polysilicon, the metallized layer, or the silicon substrate, are just some of the possible voltage-protected semiconductor bridge igniter structures that can be used for the purpose of optimizing the anti-fuse electrical characteristics. Selection of the layer of the structure on which the anti-fuse is disposed may affect some potential reliability issues related to, for example, micro-roughness on the polysilicon surface.

Voltage-Protected SCB With Continuity Check

As noted above, it is desirable to be able to monitor continuity of the SCB device at various points in its manufacturing cycle, as well as just prior to use. For example, continuity monitoring is desirable after the SCB device is deployed in the field as part of an electro-explosive device ("EED"), i.e., an initiator for explosive charges, and before the EED is connected to a firing leg. The anti-fuse structure described above, without continuity-monitoring structure, would admit of continuity monitoring only with a high-frequency signal which, by its nature, will not propagate very far through standard two-wire lead-ins typically used in EED systems, especially for wire lengths exceeding a few feet. Hence, a high-frequency continuity check is impractical for most applications and a continuity check by use of a direct current (DC) electrical signal is preferred, and, in most cases, is the only feasible way.

The present invention provides two different approaches for a safe and effective DC continuity check for the high voltage-protected SCB device of the present invention. One is a fusible link, the other is a high-value resistor, and either one is placed in parallel to the firing leg of the SCB device.

Fusible Link Continuity Check Structure

One configuration which will facilitate a DC continuity check of an SCB device is a fusible link placed in parallel to the firing leg of the SCB device. A fusible link is typically a low-power, low-resistance metalization layer deposited on the device, such as a thin trace of aluminum. By employing the fusible link, the firing leg continuity can be tested without current flow through the firing leg of the SCB device. The aluminum trace is designed to be ruptured and thereby cause an open circuit by a low amplitude DC monitor energy level. Hence, the amplitude of the DC monitor current must be maintained below the level at which the fusible link will rupture and the voltage must be maintained below the activation voltage, i.e., the voltage at which the SCB device will be initiated. The fusible link can be placed either on the back side of the SCB device (chip) or, more easily, on the top surface of the SCB device. The fusible link may be covered with a $SiO_2$ passivation layer, if necessary, as in cases where the SCB device is used as part of an EED and is in contact with an energetic material such as a primary explosive, e.g., lead azide, lead styphnate, or the like. The passivation layer prevents any energetic material which is in contact with the fusible link from being initiated by either the low-amplitude monitor current or a higher amplitude current, i.e., the link activation current, which fuses the fusible link.

An electrical circuit schematic is shown in FIG. 7 wherein a voltage protected semiconductor bridge device 24 is comprised of a semiconductor bridge device 26 connected in series with a dielectric anti-fuse 28. It will be appreciated that voltage protected semiconductor bridge device 24 can be comprised of any of the embodiments illustrated in FIGS. 1–6 or any other embodiment which places anti-fuse device 28 in series within the firing leg of the electrical circuit of the device. In FIG. 7, the firing leg is defined by the path ABEF which includes electrical connectors 30, 32 across which a source of electrical energy is connected. A continuity monitor leg ACDF is connected in parallel to the firing leg and includes a fusible link 34. The fusible link 34 is preferably a thin trace of metal, preferably aluminum, disposed on the substrate of semiconductor bridge device 26.

The significant characteristic of fusible link 34 is its fusing current level, $I_{fo}$, which is defined as the minimum amount of current needed to fuse open the element. Current levels below $I_{fo}$ can be used for a continuity test, where minimal heat is generated within the element. Current levels equal to or higher than $I_{fo}$ are considered fusing currents.

$I_{fo}$ for a fusible link is determined by several design parameters, some of which are: the metal of which the fusible link is made which determines the electrical resistivity ($\rho_f$) to control the element's resistance $R_f$ ($\rho_f L_f / Ac_f$); the melting point ($T_m$) to define the amount of heat needed to fuse the element; and the thermal conductivity of metal upon melting ($K_m$). Typical metals are aluminum (Al), gold (Au), copper (Cu), chrome (Cr).

The substrate on which the fusible link is deposited controls the rate of heat transfer away from the fusible link. Typical materials are silicon (Si), quartz ($SiO_2$), glass and sapphire ($Al_2O_3$).

The physical dimensions of the fusible link, i.e., length ($L_f$), width ($W_f$), thickness ($Th_f$), which define the element's cross section $Ac_f(W_f \times Th_f)$ for current flow, surface area $As_f(L_f \times W_f)$ for heat conduction into the substrate, and volume $V_f(L_f \times W_f \times Th_f)$ for total energy requirements.

The fusible link can be designed to fuse open for a small current amplitude, such as 0.1–0.5 amps. When the monitor voltage is applied, the current-limited monitor current flows through the fusible link, because the other leg of the circuit is effectively blocked by the capacitive effect of the anti-fuse layer and is therefore protected to the desired voltage, typically several hundred volts. Hence, a simple DC continuity check can be used to assess the continuity of the electrical connection to the SCB chip.

During operation, as the voltage is increased to the firing voltage, the fusible link is ruptured when the current increases beyond its activation current, thereby eliminating the continuity monitor leg of the circuit. The SCB firing leg then fires normally when the anti-fuse reaches its activation voltage.

Fusible links or fuses can be made as stand-alone (straight or coiled) wires or foils, and as thin films on substrates such as substrates 12 or 12' of the embodiments illustrated in FIGS. 1–6. Stand-alone wires and foils require thick and, therefore, bulky materials whose length is typically measured in centimeters and with a cross-sectional area of about 100 square mils. Despite their large size as compared to thin films, they are fragile and have to be contained in glass or plastic enclosures.

On the other hand, thin film fusible links are micrometer-sized elements that are deposited on flat substrates by means of photolithography techniques such as those used in semiconductor processing. Some of the substrate types that are compatible with thin film fusible links include standard silicon wafers, glass or plastic discs, sapphire substrates, ceramics and other flat surfaces that are electrically insulating. However, fabricating fusible links on standard silicon substrates that have been previously and selectively oxidized offers the advantage of circuit integration on the same chip. The ability to integrate a fusible link and semiconductor circuit on the same chip has in itself the great advantage of reducing manufacturing cost, increasing production reliability and reproducibility, as well as protection against mechanical damage. The flexible dimensioning which photolithography offers allows one to scale the fusible element up or down to adjust its resistance while maintaining the same fusing current.

In addition, the thin film fusible link can be fabricated of almost any metal, based on technology readily available from the semiconductor industry. For example, standard photolithography techniques may be used to define the fusible link geometry and the fusible link thickness is controlled during metal deposition. In addition, the thin film fusible link metal can be deposited by various other well-known techniques including evaporation, sputtering, spraying, electroplating, chemical vapor deposition, etc.

Resistive Continuity Check

As an alternative to a fusible link, a high-value resistance can be used in parallel to the SCB anti-fuse-containing firing leg of the circuit, to act as a resistive element with which to check the circuit continuity. The resistor is preferably integrated onto the SCB substrate, although a separate discrete resistor component can be used. The resistance value is selected to be appropriate for the intended use. For example, in order for the integrated resistor to be effective in EED applications, its resistance value must be large enough (on the order of 100 kilohms) to keep the current flow, and therefore power dissipation, low enough to maintain the temperature of the SCB device at all times below the auto-ignition temperature of the energetic material (e.g., primary explosive) with which it is in contact in the explosive device. The applied continuity monitor voltage must of course be below the activation voltage, i.e., the voltage at which the SCB will be initiated. The activation voltage can vary from tens of volts to hundreds of volts, depending on the design of the voltage-blocked SCB device (the SCB device in series with the anti-fuse dielectric) and the contemplated application of the device. Low power dissipation will also reduce the effect of heat on the voltage-blocking performance of the anti-fuse, because experience shows that heat tends to lower the voltage threshold of such anti-fuse devices.

A schematic electrical circuit for a voltage protected semiconductor bridge device including a resistive continuity monitor leg ACDF is shown in FIG. 8 which is identical to FIG. 7 except that a resistor 36 is substituted for the fusible link 34 of the FIG. 7 embodiment. The elements of FIG. 8 which are identical to those FIG. 7 are identically numbered and need not be further described except to note that, like the circuit of FIG. 7, the circuit of FIG. 8 comprises a firing leg ABEF and a continuity monitor leg ACDF.

The location of the resistor can be either in the bulk silicon of the wafer or in the polysilicon layer that contains the SCB. Some of the advantages of each are discussed below. However, the preferred configuration is for the resistor to be located in the bulk silicon of the wafer. The doping of either the bulk silicon or the polysilicon can be controlled to provide a high electrical resistance per square such that a high-value resistor could be manufactured on the same chip as the SCB. One embodiment uses a serpentine design to achieve a high value of resistance. The resistor is connected to the voltage-blocked SCB by large area n+ type diffused contact pads which mitigate the creation of a non-linear component such as a Shottky diode.

A typical design layout of a voltage-blocked SCB with a high-value resistor as a continuity check is shown in FIG. 9 wherein a semiconductor bridge device 38 is both high-voltage protected and has a continuity monitor leg integrally formed therein. A semiconductor bridge device 38 comprises an electrically non-conducting substrate 40 which may be made of a suitable material such as silicon dioxide, silicon nitride, etc. In a construction similar or identical to that illustrated, for example, in FIGS. 1 and 2, semiconductor bridge device 38 is seen in plan view to comprise a pair of metallized lands 42a, 42b disposed atop pads 44a, 44b of a polysilicon semiconductor, pads 44a and 44b being connected by an initiator bridge 44c. Pads 44a, 44b and initiator bridge 44c are formed of an integral, single piece of polysilicon semiconductor. Not visible in FIG. 9 is an anti-fuse comprised of a dielectric layer, comparable to dielectric layer 15 illustrated in FIGS. 1 and 2, and disposed between metallized land 42a and pad 44a. Resistor contact pads 46a and 46b are electrically connected to, respectively, metallized lands 42a and 42b. Resistor contact pads 46a and 46b are connected by a metal connector layer, such as an aluminum connector, which extends as a strip or trace of metal downwardly through substrate 40 via passageways (not visible in FIG. 9) extending through substrate 40 to the underside thereof, also not visible in FIG. 9. The passageway is lined with a suitable dielectric material to prevent electrical contact between the metal trace extending from the connector pads and other components of the device. The metal connector layer connects resistor contact pads 46a, 46b to opposite ends of a serpentine resistor 48 formed on the underside of substrate 40. High resistivity c(an be accomplished with near intrinsic silicon wafers, and a specific value can be obtained by a light concentration of doping ions to achieve the required high resistivity per square. This can also be accomplished in standard-doped wafers by counter-doping with the opposite ion (positive ions for p-type wafers and vice-versa) until the desired high resistivity is achieved. As an alternative to the illustrated structure, the resistor could also be located in the same polysilicon layer which contains the SCB device instead of in or on substrate 40.

One of the potential advantages of placing the resistor in the polysilicon is that because of the $SiO_2$ isolation layer beneath the polysilicon, the resistor can be completely electrically isolated from the supporting silicon substrate. Another potential advantage of placing the resistor in the polysilicon layer is that the polysilicon is grown undoped and can more easily be doped to a low concentration of ions than can the bulk silicon of standard-doped wafers. The low doping gives rise to a high resistance per square. However, a major advantage of placing the resistor in the bulk silicon of the wafer is the superior heat transfer out of the device and into the header or other structure (e.g., see FIG. 10 and its description below) on which the SCB device is mounted, thereby minimizing heat buildup. Applying the resistor to the bulk silicon substrate is thus a preferred configuration if thermal considerations are paramount.

Figure 10:
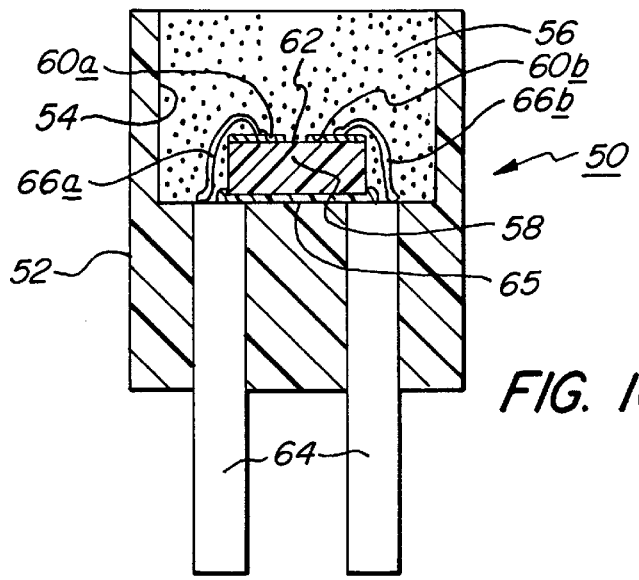
FIG. 10 is a schematic cross-sectional view in elevation of an electro-explosive device utilizing a voltage-protected semiconductor bridge igniter element in accordance with an embodiment of the present invention.

The semiconductor bridge igniter devices of the present invention are advantageously employed as a component of an EED. A typical EED is illustrated in FIG. 10 by a conventional explosives igniter 50 comprised of a header 52 defining a cuplike recess 54 containing an explosive charge 56 which typically comprises a primary explosive such as lead azide or lead styphnate. Disposed at the bottom of recess 54 is a semiconductor bridge device 58 made in accordance with the present invention and comprised of metallized lands 60*a*, 60*b* with igniter bridge 62 disposed therebetween and in contact with explosive charge 56. The semiconductor bridge device is secured to the bottom of cup-like recess 54 by suitable means such as an epoxy glue 65, and metal lands 60*a*, 60*b* are connected to electrical leads 64 by respective electrical lead wires 66*a*, 66*b*, each having one end wire-bonded to a respective one of metal lands 60*a*, 60*b* and the other end wire-bonded to a respective one of electrical leads 64.

EXAMPLE

Figure 11:
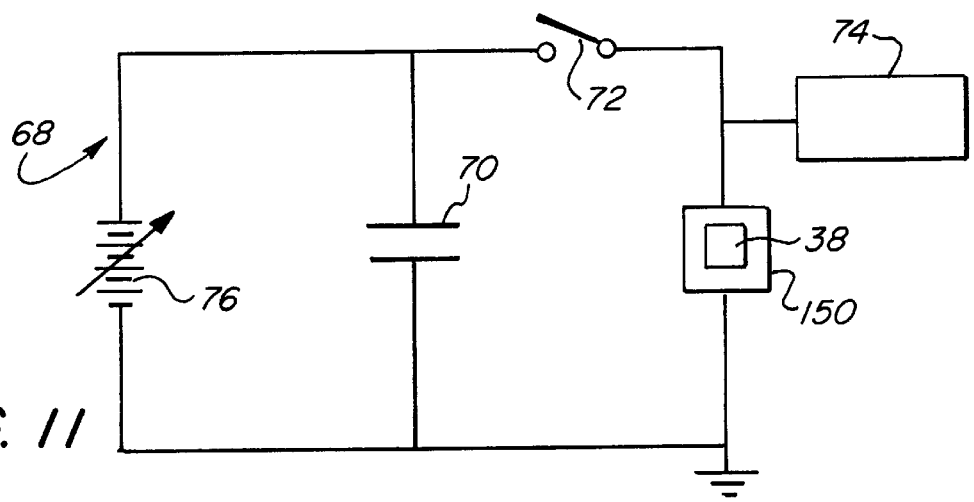
FIG. 11 is a schematic circuit diagram of the test set-up employed in Part B of the Example.

A. Voltage blocked SCB igniter devices 38 manufactured in the configuration shown in FIG. 9 were, for testing purposes, mounted on TO-46 headers in the manner illustrated in connection with the explosives igniter 50 of FIG. 10, except that energetic material (corresponding to explosive charge 56 of FIG. 10) was omitted. Each of the tested units 150 (FIGS. 11 and 12) contained an SCB igniter device 38 comprised of the following components:

a) a 0.5 $\mu$m thick silicon dioxide film as the anti-fuse element (not shown in FIG. 9 but equivalent to dielectric layer 15 of FIG. 1);

b) aluminum metal lands (42*a*, 42*b* of FIG. 9);

c) a polysilicon layer (not shown in FIG. 9 except for initiator bridge 44*c*, but equivalent to polysilicon semiconductor 14 of FIG. 1; 44*c* of FIG. 9 is the equivalent of 14*c* of FIG. 1); and d) a 15,000 ohm resistor (serpentine resistor 48 in FIG. 9) connected in parallel to the voltage-blocked firing leg. The latter is provided by the metalized lands (42*a*, 42*b* of FIG. 9), the dielectric layer (equivalent to 15 of FIG. 1) and the polysilicon semiconductor layer (equivalent to 14 of FIG. 1).

The test units were electrically tested by each of a capacitive discharge (10 $\mu$F) test, a ramp-up DC voltage test, a resistance current versus step-up DC voltage test, and an AC voltage (120 volts and 60 cycles per second) test.

B. Capacitive discharge tests were conducted using a first test circuit 68 illustrated schematically in FIG. 11 and comprising a 600 volt, 10 $\mu$F capacitor 70, a toggle switch 72, and oscilloscope 74 and a high-voltage, direct current (DC) power supply 76, which is variable from 0 to 400 volts. The tests unit 150 was connected into the circuit via electrical leads corresponding to electrical leads 64 of FIG. 10. During this test, a breakdown voltage of 200+/−20 volts was obtained for the anti-fuse elements (equivalent to dielectric layer 15 of FIG. 1). Voltage at the capacitor was stepped up in increments of 10 volts within the range of 150 to 250 volts. In this scenario, no significant role was played by the parallel resistor continuity monitor leg since the voltage delivered to the anti-fuse was instantaneous and the resistor did not consume any significant amount of energy.

C. Ramp-up DC voltage tests were conducted by connecting the high-voltage DC power supply 76 of FIG. 11 directly to the electrical leads of the tested unit 150 (corresponding to the electrical leads 64 of FIG. 10) and monitoring the results by the oscilloscope 74. Testing showed that the voltage-protected SCB fired consistently at the 200+/−20 volts level for an input voltage that was manually increased at a rate of 30 volts per second or higher. This was consistent with the results obtained from the capacitive discharge test of part B. However, for voltage rates of about 15 volts per second or lower, the voltage-protected SCB showed some electrical instabilities at about 160 V that led to a premature functioning of the device at slightly lower voltages, in the range of 160 to 180 V. This is believed to be consequence of heat generated by the parallel resistor. Heat promotes the diffusion of aluminum on the $SiO_2$ dielectic film, in turn reducing the effective thickness of the original 0.5 $\mu$m thick dielectric film.

Figure 12:
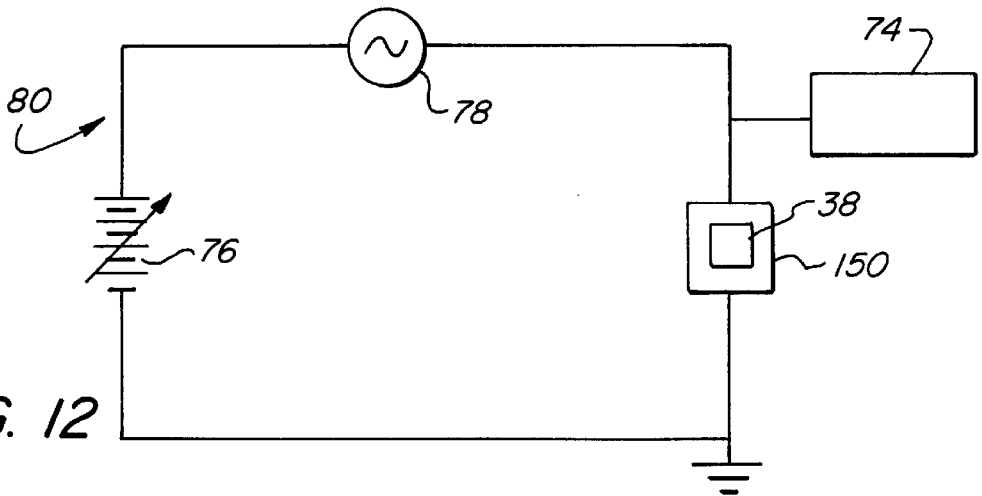
FIG. 12 is a schematic circuit diagram of the test set-up employed in Part C of the Example.

D. Resistance current versus step-up DC voltage tests were conducted by connecting, as shown in FIG. 12, the DC high-voltage power supply 76 and an ammeter 78 in series with the test unit 150 in a second test circuit 80 which includes the oscilloscope 74. Continuous voltage monitoring testing was performed on the voltage-blocked SCB devices. In this test, voltage was applied in a step-up voltage mode with each voltage step lasting for 1 minute, and at voltage steps of 10 volts within the range of 60 to 160 V. The purpose of the one-minute intervals between stepping up the voltage at each voltage step was to allow for temperature stabilization of the semiconuctor igniter device 38 of tested unit 150 at each voltage. Data was thus obtained on the resistance value of the parallel resistor (equivalent to resistor 36 in FIG. 8) of the semiconductor igniter device 38 as a function of the applied voltage. The overall results from this test indicated that the tested units could sustain 140 volts DC in a continuous mode for more than 12 hours without physical and/or electrical degradation of the tested unit.

Electrical parameters, voltage and current of the voltage-protected SCB were monitored during this test. Hence, the resistance of the resistor (corresponding of resistor 36 of FIG. 8) and power were calculated as a function of applied voltage. The main electrical characteristic observed was that the parallel resistor (corresponding to resistor 36 of FIG. 8) changed its value from the initial 15,000 ohms at 0.5 volts to approximately a peak value of 150,000 ohms at one hundred volts, and then dropped to about 100,000 ohms at 140 volts. Power loss was less than 0.2 watt at 140 volts.

This dynamic electrical behavior of the resistor is responsible for the excellent continuity test capability and voltage protection offered by the addition of the high-impedance parallel resistor (corresponding to resistor 36 of FIG. 8) to the voltage-protected SCB igniter device 38 (FIG. 9). In other words, the response of the parallel resistor to a continuously increasing stray voltage is to increase the resistance offered by the resistor due to the small amount of heat generated within the SCB chip. Of course, as will be appreciated by those skilled in the art, the larger the SCB chip size, the better its heat-dissipating capability will be.

E. In the AC voltage test, the tested units 150 were repeatedly plugged into and unplugged from a 120 volts, 60 cycles per second AC outlet connected to the equivalent of the electrical leads 64 of FIG. 10. No physical or electrical damage to the tested units 150 was observed. The tested units were also left plugged into the AC outlet overnight without any detectable degradation.

While the invention has been described in detail with reference to particular embodiments thereof, it will be apparent that upon a reading and understanding of the foregoing, numerous alterations to the described embodiment will occur to those skilled in the art and it is intended to include all such alterations within the scope of the appended claims.

What is claimed is:

1. A semiconductor bridge igniter device having protection against functioning at voltages below a preselected threshold voltage, the igniter device defining an electric circuit and comprising:

(a) a substrate made from a non-conductive material;

(b) a polysilicon layer disposed on the substrate and dimensioned and configured to have first and second pads having therebetween a gap which is bridged by an initiator bridge connecting the first and second pads, the bridge being so dimensioned and configured that passage therethrough of an electric current of selected characteristics releases energy at the bridge;

(c) first and second metallized lands disposed in electrically conducting contact with, respectively, the first and second pads, to define a firing leg of the electric circuit comprised of the first and second metallized lands, the first and second pads and the bridge; and (d) a dielectric layer having a breakdown voltage equal to the threshold voltage and interposed in series between the polysilicon layer and the first metallized land in the firing leg of the electric circuit, whereby the circuit can only be closed upon application thereto of a voltage potential at least as great as the threshold voltage.

2. The igniter device of claim 1 wherein the first metallized land is disposed remotely of the first pad and on the dielectric layer, and the dielectric layer is electrically connected to the first pad by a conductive layer.

3. The igniter device of claim 2 further comprising a doped silicon region of the substrate disposed between the dielectric layer and the conductive layer and providing an electrical connection therebetween.

4. The igniter device of claim 1, claim 2 or claim 3 wherein the polysilicon layer is doped.

5. The igniter device of claim 1, claim 2 or claim 3 wherein the electric circuit further comprises a continuity monitor leg comprising a fusible link connected in parallel to the firing leg, the fusible link being dimensioned and configured to rupture at an amperage above that of a selected monitor amperage whereby, if the monitor amperage is exceeded, the fusible link will rupture and open the monitor leg.

6. The igniter device of claim 5 wherein the fusible link comprises a thin film fusible link.

7. The igniter device of claim 1, claim 2 or claim 3 wherein the electric circuit further comprises a continuity monitor leg comprising a resistor connected in parallel to the firing leg, the resistor having, at voltage levels below the preselected threshold voltage, a resistance value large enough to reduce the current flow through the firing leg of the electric circuit to a level at which the temperature of the semiconductor bridge device remains below a preselected temperature.

8. The igniter device of claim 7 comprising an electro-explosive device and disposed in contact with an energetic material, and wherein the preselected temperature is the auto-ignition temperature of the energetic material.

9. The igniter device of claim 7 wherein the resistor comprises a doped segment of the polysilicon layer of the device.

10. The igniter device of claim 7 wherein the resistor comprises a doped segment of the non-conductive substrate.

* * * * *